| United States Patent [19] | [11] Patent Number: 4,749,548 |
| Akutsu et al. | [45] Date of Patent: Jun. 7, 1988 |

[54] COPPER ALLOY LEAD MATERIAL FOR USE IN SEMICONDUCTOR DEVICE

[75] Inventors: Hidetoshi Akutsu, Kitamoto; Takuro Iwamura; Masao Kobayashi, both of Omiya, all of Japan

[73] Assignee: Mitsubishi Kinzoku Kabushiki Kaisha, Tokyo, Japan

[21] Appl. No.: 903,514

[22] Filed: Sep. 3, 1986

[30] Foreign Application Priority Data

| Sep. 13, 1985 | [JP] | Japan | 60-203117 |
| Sep. 13, 1985 | [JP] | Japan | 60-203118 |
| Sep. 20, 1985 | [JP] | Japan | 60-208095 |
| Sep. 20, 1985 | [JP] | Japan | 60-208096 |
| Sep. 20, 1985 | [JP] | Japan | 60-208097 |

[51] Int. Cl.$^4$ ............................................ C07C 9/00
[52] U.S. Cl. .............................. 420/469; 420/473; 420/477; 420/478; 420/479; 420/480; 420/482; 420/489; 420/492; 420/495
[58] Field of Search ............ 420/469, 492, 477, 490, 420/473, 495, 499, 478, 483, 480, 479, 482, 489

[56] References Cited

U.S. PATENT DOCUMENTS

| 2,479,311 | 8/1949 | Christensen et al. | 420/469 |
| 3,928,028 | 12/1975 | Yarwood | 420/473 |

FOREIGN PATENT DOCUMENTS

| 0023362 | 2/1981 | European Pat. Off. | |
| 193233 | 11/1984 | Japan | 420/469 |
| 1157163 | 7/1969 | United Kingdom | |
| 1353430 | 5/1974 | United Kingdom | |
| 1373049 | 11/1974 | United Kingdom | |
| 1414289 | 11/1975 | United Kingdom | |
| 1525355 | 9/1978 | United Kingdom | |
| 1549107 | 7/1979 | United Kingdom | |
| 1566776 | 5/1980 | United Kingdom | |
| 2070057 | 9/1981 | United Kingdom | |
| 2159836 | 12/1985 | United Kingdom | |

*Primary Examiner*—L. Dewayne Rutledge
*Assistant Examiner*—George Wyszomierski
*Attorney, Agent, or Firm*—Frishauf, Holtz, Goodman & Woodward

[57] ABSTRACT

Copper alloy lead materials used in the fabrication of semiconductor devices such as ICs and LSIs are required to have a tensile strength of 40 kgf/mm$^2$ or more, an elongation of 4% or more, an electrical conductivity of 50% IACS or more, and a softening point of 400° C. or higher.

The copper alloy lead material of the present invention exhibits even higher degrees of tensile strength and elongation and yet satisfy the values of electrical conductivity and softening point that are required for Cu alloy lead materials to be used with ordinary semiconductor devices. Therefore, the Cu alloy lead material of the present invention is applicable not only to ordinary semiconductor devices but also to those with higher packing densities while displaying equally superior performance.

4 Claims, No Drawings

COPPER ALLOY LEAD MATERIAL FOR USE IN SEMICONDUCTOR DEVICE

BACKGROUND OF THE INVENTION

1. Field of Use

The present invention relates to a copper alloy lead material for use in the fabrication of semiconductor devices such as ICs and LSIs.

2. Prior Art

Copper alloy lead materials for use in semiconductor materials are required to have the following properties:
(i) good workability for stamping;
(ii) heat resistance high enough to avoid thermal distortion and softening upon thermal bonding or thermal diffusion compression of a semiconductor device;
(iii) rapid heat dissipation and good electrical conductivity; and
(iv) strength and elongation great enough to avoid bending or failure due to the repeated bending that may occur during transportion of a semiconductor device or upon its installation in an electrical machine.

Characteristically, Cu alloy lead materials intended for use in specific fields are required to have the following values:

a tensile strength of 40 kgf/mm$^2$ or more as an index of strength;

an elongation of 4% or more as another index of strength;

an electrical conductivity of 50% IACS or more as an index of heat dissipation and conductivity; and a softening point of 400° C. or higher as an index of heat resistance.

Many products have been proposed as Cu alloy lead materials satisfying these requirements and are currently in commercial use.

However, with the ever increasing demand for a higher packing density in modern semiconductor devices, Cu alloy lead materials are required to exhibit even higher degrees of strength and elongation in addition to high heat resistance and good heat dissipation and electrical conductivity. Therefore, it is strongly desired to develop Cu alloy lead materials that satisfy these requirements for performance.

SUMMARY OF THE INVENTION

The primary object of the present invention is to provide a copper alloy lead material that displays even higher degrees of strength and elongation and which yet retains the characteristics possessed by prior art products for use in semiconductor devices.

As a result of various studies conducted in order to attain this object, the present inventors have found the following:

(1) A lead material made of a copper alloy that contains 0.05-1% of Cr, 0.005-0.3% of Zr, 0.001-0.05% of Li, and 0.001-0.3% of at least one element selected from among P, Mg, Si, Al, Zn and Mn, with the balance being Cu and no more than 0.1% of incidental impurities, the percent being on a weight basis, is capable of attaining the object of the present invention. A further increase in the tensile strength of the lead material is attained by incorporating 0.005-0.1% of Zr, 0.05-1% of each of Ni, Sn and Ti, 0.001-0.1% of Si, and 0.001-0.3% of at least element selected from the group consisting of P, Mg, Al, Zn and Mn.

(2) The object of the present invention is also attainable by a lead material made of a copper alloy that contains either 0.05-1% of Cr or 0.005-0.3% of Zr or both, and which further contains one or more of 0-2% of a metal of the first group selected from among Ni, Sn, Fe, Co and Be, 0-1% of a metal of the second group selected from among Mg, Si, Al, Zn, Mn, B, P, Li, Y and a rare earth element, and 0-2% of a metal of the third group selected from among Ti, Nb, V, Ta, Hf, Mo and W, the percent being on a weight basis, with the balance being copper and incidental impurities, and which is quenched after hot rolling and aged after cold rolling to attain a structure wherein the average grain size of any eutectic crystal present is no more than 10 μm compared with the conventionally observed range of 20-100 μm, the average grain size of any precipitate present is no more than 0.1 μm compared with the conventionally observed range of 0.5-3 μm, and the average size of any crystalline grains present is no more than 50 μm compared with the conventionally observed range of 60-200 μm. A copper alloy lead material having such a fine structure and capable of attaining the aforementioned object of the present invention may also be produced from a composition that further contains 5-60 ppm of C in addition to the components described in (2); with the balance being copper and incidental impurities, provided that the O$_2$ content is no more than 35 ppm. This variant of the alloy composition (2) may be subjected to quenching after hot rolling and aging after cold rolling.

All of the copper alloy lead materials described above have characteristics that permit them to perform satisfactorily as leads for use with semiconductor devices of high packing density. The present invention has been accomplished on the basis of these findings.

DETAILED DESCRIPTION OF THE INVENTION

The criticality of the compositional range of each of the elements in the Cu alloy lead material of the present invention is hereunder described.

(a) Cr and Zr

These elements are capable of providing improved strength and heat resistance, but these effects are not attained if Cr is present in an amount of less than 0.05% or Zr is present in an amount of less than 0.005%. If the contents of Cr and Zr exceed 1% and 0.3%, respectively, the chance of formation of non-metallic inclusions increases to impair the platability and electrical conductivity of the alloy. Therefore, in order to attain the object of the present invention, the contents of Cr and Zr are specified to lie within the ranges of 0.05-1% and 0.005-0.3%, respectively.

(b) Li

Li serves not only as a deoxidizer but also as a grain refining agent to provide a higher degree of strength and elongation, resulting in better workability for stamping. These effects are not attainable if Li is present in an amount of 0.001%. If the Li content exceeds 0.05%, a drop in electrical conductivity occurs. Therefore, in order to attain the object of embodiment, the present invention, the content of Li is specified to lie within the range of 0.001-0.05%.

(c) P, Mg, Si, Al, Zn and Mn

These elements not only serve as a deoxidizer but also provide better platability, solderability and electrical conductivity. These effects are not attained if such elements are present in amounts of less than 0.001%. If their content exceeds 0.3%, their effectiveness has a tendency to decrease. Therefore, in order to attain the object of embodiment, the present invention, the content of one or more of these elements is specified to lie within the range of 0.001-0.3%.

If any incidental impurities are present in amounts exceeding 0.1%, at least one of the characteristics required of the lead material of the present invention is impaired. Therefore, in order to attain the object of the present invention, the content of incidental impurities must not exceed 0.1%.

(d) Ni and Sn

These elements are effective not only in providing improved strength but also in preventing any deformation or burring from occurring during stamping. They are optional elements for the purpose of the present invention, but if they are used at all, their effects are not attained if either one of them is present in an amount of less than 0.05%. If, on the other hand, the content of each element exceeds 1%, a drop in electrical conductivity occurs. Therefore, if Ni and Sn are used at all in embodiment, the content of each of them must lie within the range of 0.05-1%.

(e) Ti

Titanium is effective in providing improved heat resistance, platability (solderability) and electrical conductivity. It is not essential for the purpose of the present invention but, if it is used at all, the abovementioned effects are not attained if the content of Ti is less than 0.05%. If the Ti content exceeds 1%, excessive precipitation occurs to cause a drop in electrical conductivity. Therefore, if Ti is used at all in embodiment, its content must lie within the range of 0.05-1%.

(f) Si

Silicon not only serves as a deoxi-dizer but also provides improved heat resistance. These effects are not attained if Si is present in an amount of less than 0.001%. If the Si content exceeds 0.1%, the rate of elongation decreases. Therefore, in order to attain the object of the present invention, the Si content is specified to lie embodiment, within the range of 0.001-0.1%.

(g) Metals of the first group

The metals of the first group are effective not only in providing improved strength but also in preventing the occurrence of deformation and burring during stamping. These effects are not attained if the content of one of the metals of the first group is less than 0.005%. If one of these metals is present in an amount greater than 2%, a drop in electrical conductivity occurs. Therefore, if metals of the first group are used at all in embodiment 2 their content must lie within the range of 0.005-2%.

(h) Metals of the second group

Each of the metals of the second group not only serves as a deoxidizer but is also effective in providing improved electrical conductivity, platability and solderability. These effects are not attained if the content of one of the metals of the second group is less than 0.001%. If the content of a metal of the second group exceeds 1%, the aforementioned abilities thereof have a tendency to be impaired. Therefore, if a metal of the second group is used at all in embodiment 2, its content is preferably within the range of 0.001-1%.

(i) Metals of the third group

The metals of the third group are effective in providing improved strength and heat resistance. These effects are not attained if the content of one of the metals of the third group is less than 0.005%. If the content of a metal of the third group exceeds 2%, a drop in electrical conductivity occurs. Therefore, if a metal of the third group is used at all in embodiment 2, its content is preferably within the range of 0.005-2%.

(j) alloy structure

As already mentioned, the prior art Cu alloys from which lead materials for use in semiconductor devices have been made are characterized by the average grain size of the eutectic crystals ranging from 20 to 100 $\mu$m, the average grain size of the precipitate ranging from 0.5 to 3 $\mu$m, and the average size of the crystalline grains ranging from 60 to 200 $\mu$m. However, with such a coarse crystalline structure, a tensile strength of 50 kgf/mm$^2$ or higher and an elongation of 6% or higher cannot be attained and, in order to attain these values, the average grain size of any eutectic crystals, the average grain size of any precipitate and the average size of any crystalline grains must be reduced to 10 $\mu$m, 0.1 $\mu$m and 50 $\mu$m, respectively, or less. The increases in tensile strength and elongation combine together to achieve a pronounced improvement in the workability of the Cu alloy composition for stamping. Therefore the above-specified values of tensile strength and elongation cannot be ensured if any one of the parameters for crystalline structure exceeds its upper limit.

(k) Carbon

Carbon forms carbides with other elements and serves to refine the crystalline grains and precipitates, thereby providing improved strength. The desired high strength is not attained if the carbon content is less than 5 ppm, but if its content exceeds 60 ppm, the plastic workability of the alloy is impaired. Therefore, in order to attain the object of the present invention, the content of carbon, if it is used at all, must be within the range of 5-60 ppm. However, if the content of oxygen as an incidental impurity exceeds 35 ppm, the carbon content drops below 5 ppm, which is detrimental to the purpose of ensuring the desired high tensile strength. Therefore, the content of oxygen as an incidental impurity must be held to 35 ppm or below.

The following examples are provided for the purpose of further illustrating the advantages of the Cu alloy lead material of the present invention but are in no sense to be taken as limiting.

EXAMPLE 1

Melts of Cu alloy having the compositions listed in Table 1 were formed in a conventional type of low-frequency channel induction-melting furnace. The melts were cast in a water-cooled mold to form ingots of 50 mm$^\square$ and 100 mm$^H$, which were surface-polished and reduced in thickness to 11 mm by hot rolling which was started at predetermined temperatures within the range of 800°-950° C. After cooling with water, the top and bottom surfaces of each hot-rolled plate were polished thus reducing the plate thickness by 0.5 mm to achieve a final thickness of 10 mm. Subsequently, the plates were subjected to cycles of cold rolling and annealing under ordinary conditions to form strips of 0.3 mm in thickness. In the final step, the strips were annealed to eliminate any residual strain by holding them at predetermined temperatures within the range of 550°–600° C. By these procedures, sample Nos. 1–18 of the Cu alloy lead material of the present invention were fabricated. The tensile strength, elongation, electrical conductivity and softening point of each of these samples were measured, the results being shown in Table 1.

The data given in Table 1 shows that each of the samples 1 to 18 of the Cu alloy lead material of the present invention exhibited a tensile strength of 52 kgf/mm$^2$ or more, an elongation of 8.5% or more, an electrical conductivity of 80% IACS or more, and a softening point of 460° C. or higher. These values are indicative of the fact that the samples of the Cu alloy lead material of the present invention exhibit heretofore unattainable high levels of strength and elongation and yet satisfy the other requirements with respect to the characteristics which lead materials for use in semiconductor devices need to possess.

EXAMPLE 2

By repeating the procedures of Example 1, sample Nos. 19–42 of the Cu alloy lead material of the present invention were fabricated from melts of Cu alloy having the compositions shown in Table 2. The tensile strength, elongation, electrical conductivity and softening point of each sample were measured, with the results also being shown in Table 2.

As the data in Table 2 shows, each sample had a tensile strength of 65 kgf/mm$^2$ or higher, an elongation of 6% or more, an electrical conductivity of 62% IACS or more, and a softening point of 480° C. or higher. These values are indicative of the fact that the samples of the Cu alloy lead material of the present invention exhibit heretofore unattainable high levels of strength and elongation and yet satisfy the other requirements with respect to the characteristics which lead materials for use in semiconductor devices need to possess.

TABLE 1

| Sample No. | Cr | Zr | Li | P | Mg | Si | Al | Zn | Mn | impurities | Cu | tensile strength (kgf/mm$^2$) | elongation (%) | conductivity (% IACS) | softening point (°C.) |
|---|---|---|---|---|---|---|---|---|---|---|---|---|---|---|---|
| 1 | 0.052 | 0.12 | 0.031 | 0.11 | — | — | — | — | — | 0.051 | bal. | 52 | 12.1 | 95 | 465 |
| 2 | 0.50 | 0.14 | 0.028 | 0.12 | — | — | — | — | — | 0.032 | bal. | 59 | 9.3 | 83 | 500 |
| 3 | 0.96 | 0.16 | 0.031 | 0.10 | — | — | — | — | — | 0.041 | bal. | 64 | 8.5 | 80 | 520 |
| 4 | 0.48 | 0.0054 | 0.029 | 0.10 | — | — | — | — | — | 0.031 | bal. | 53 | 11.0 | 94 | 460 |
| 5 | 0.51 | 0.29 | 0.029 | 0.09 | — | — | — | — | — | 0.026 | bal. | 64 | 8.7 | 82 | 515 |
| 6 | 0.49 | 0.11 | 0.0012 | 0.12 | — | — | — | — | — | 0.033 | bal. | 58 | 9.0 | 84 | 500 |
| 7 | 0.54 | 0.13 | 0.046 | 0.11 | — | — | — | — | — | 0.021 | bal. | 61 | 9.6 | 80 | 500 |
| 8 | 0.51 | 0.11 | 0.030 | 0.0011 | — | — | — | — | — | 0.082 | bal. | 59 | 9.4 | 85 | 500 |
| 9 | 0.52 | 0.19 | 0.031 | 0.29 | — | — | — | — | — | 0.016 | bal. | 60 | 9.4 | 87 | 505 |
| 10 | 0.44 | 0.10 | 0.030 | — | 0.10 | — | — | — | — | 0.041 | bal. | 58 | 9.5 | 83 | 500 |
| 11 | 0.46 | 0.11 | 0.028 | — | — | 0.05 | — | — | — | 0.061 | bal. | 58 | 9.2 | 81 | 505 |
| 12 | 0.61 | 0.09 | 0.029 | — | — | — | 0.0019 | — | — | 0.064 | bal. | 60 | 9.3 | 85 | 500 |
| 13 | 0.62 | 0.16 | 0.033 | — | — | — | — | 0.26 | — | 0.022 | bal. | 61 | 9.3 | 87 | 490 |
| 14 | 0.52 | 0.18 | 0.030 | — | — | — | — | — | 0.21 | 0.033 | bal. | 59 | 9.3 | 86 | 495 |
| 15 | 0.50 | 0.12 | 0.024 | — | 0.06 | — | — | 0.03 | — | 0.051 | bal. | 58 | 9.3 | 82 | 495 |
| 16 | 0.50 | 0.11 | 0.022 | — | — | 0.03 | 0.02 | — | 0.04 | 0.028 | bal. | 69 | 9.3 | 82 | 500 |
| 17 | 0.46 | 0.18 | 0.036 | 0.04 | 0.02 | — | 0.01 | 0.02 | — | 0.041 | bal. | 60 | 9.5 | 83 | 495 |
| 18 | 0.49 | 0.16 | 0.030 | 0.03 | 0.04 | 0.02 | 0.01 | 0.02 | 0.02 | 0.039 | bal. | 59 | 9.4 | 84 | 500 |

TABLE 2

| Sample No. | Cr | Zr | Li | Ni | Sn | Ti | Si | others | impurities | Cu | tensile strength (kgf/mm$^2$) | elongation (%) | conductivity (% IACS) | softening point (°C.) |
|---|---|---|---|---|---|---|---|---|---|---|---|---|---|---|
| 19 | 0.052 | 0.051 | 0.031 | 0.51 | 0.41 | 0.61 | 0.04 | P: 0.12 | 0.042 | bal. | 65 | 7.9 | 64 | 480 |
| 20 | 0.56 | 0.052 | 0.032 | 0.46 | 0.46 | 0.65 | 0.05 | P: 0.09 | 0.039 | bal. | 73 | 6.5 | 67 | 500 |
| 21 | 0.98 | 0.049 | 0.026 | 0.41 | 0.48 | 0.63 | 0.03 | P: 0.13 | 0.041 | bal. | 80 | 6.0 | 69 | 525 |
| 22 | 0.54 | 0.0051 | 0.031 | 0.43 | 0.42 | 0.64 | 0.06 | P: 0.10 | 0.051 | bal. | 71 | 6.3 | 67 | 495 |
| 23 | 0.51 | 0.091 | 0.030 | 0.42 | 0.46 | 0.66 | 0.05 | P: 0.11 | 0.047 | bal. | 75 | 6.5 | 65 | 505 |
| 24 | 0.55 | 0.048 | 0.0013 | 0.40 | 0.44 | 0.60 | 0.04 | P: 0.11 | 0.051 | bal. | 71 | 6.2 | 69 | 495 |
| 25 | 0.50 | 0.061 | 0.046 | 0.61 | 0.50 | 0.58 | 0.04 | P: 0.13 | 0.036 | bal. | 77 | 6.8 | 65 | 505 |
| 26 | 0.56 | 0.052 | 0.030 | 0.052 | 0.51 | 0.61 | 0.05 | P: 0.18 | 0.029 | bal. | 71 | 6.3 | 72 | 490 |
| 27 | 0.49 | 0.051 | 0.026 | 0.99 | 0.43 | 0.66 | 0.05 | P: 0.17 | 0.031 | bal. | 75 | 6.7 | 64 | 510 |
| 28 | 0.46 | 0.046 | 0.028 | 0.58 | 0.051 | 0.62 | 0.05 | P: 0.11 | 0.040 | bal. | 72 | 6.4 | 70 | 495 |
| 29 | 0.51 | 0.057 | 0.027 | 0.50 | 0.97 | 0.46 | 0.05 | P: 0.10 | 0.042 | bal. | 73 | 6.6 | 62 | 510 |
| 30 | 0.53 | 0.056 | 0.029 | 0.49 | 0.44 | 0.054 | 0.04 | P: 0.18 | 0.028 | bal. | 79 | 7.1 | 65 | 490 |
| 31 | 0.50 | 0.054 | 0.025 | 0.54 | 0.45 | 0.94 | 0.05 | P: 0.11 | 0.037 | bal. | 69 | 6.0 | 68 | 510 |
| 32 | 0.49 | 0.051 | 0.026 | 0.51 | 0.46 | 0.61 | 0.0011 | P: 0.09 | 0.038 | bal. | 72 | 6.5 | 65 | 500 |
| 33 | 0.47 | 0.056 | 0.027 | 0.52 | 0.46 | 0.64 | 0.095 | P: 0.09 | 0.041 | bal. | 74 | 6.5 | 69 | 500 |
| 34 | 0.54 | 0.041 | 0.029 | 0.51 | 0.48 | 0.61 | 0.04 | Mg: 0.013 | 0.056 | bal. | 73 | 6.4 | 65 | 500 |
| 35 | 0.53 | 0.050 | 0.023 | 0.54 | 0.50 | 0.54 | 0.06 | Al: 0.0012 | 0.059 | bal. | 74 | 6.4 | 63 | 495 |
| 36 | 0.51 | 0.052 | 0.024 | 0.52 | 0.49 | 0.61 | 0.06 | Zn: 0.009 | 0.030 | bal. | 72 | 6.5 | 65 | 500 |
| 37 | 0.52 | 0.053 | 0.026 | 0.51 | 0.52 | 0.63 | 0.05 | Mn: 0.29 | 0.011 | bal. | 74 | 6.6 | 68 | 505 |
| 38 | 0.50 | 0.050 | 0.025 | 0.50 | 0.53 | 0.64 | 0.06 | P: 0.010 Mn: 0.13 | 0.021 | bal. | 74 | 6.5 | 68 | 500 |
| 39 | 0.51 | 0.049 | 0.026 | 0.54 | 0.52 | 0.60 | 0.06 | Mg: 0.13 Zn: 0.04 | 0.033 | bal. | 73 | 6.4 | 68 | 500 |
| 40 | 0.51 | 0.054 | 0.026 | 0.55 | 0.51 | 0.58 | 0.04 | P: 0.08 | 0.032 | bal. | 73 | 6.4 | 69 | 505 |

TABLE 2-continued

| Sample No. | Composition (wt %) | | | | | | | | | tensile strength (kgf/mm²) | elongation (%) | conductivity (% IACS) | softening point (°C.) |
|---|---|---|---|---|---|---|---|---|---|---|---|---|---|
| | Cr | Zr | Li | Ni | Sn | Ti | Si | others | impurities | Cu | | | | |
| 41 | 0.48 | 0.053 | 0.024 | 0.53 | 0.49 | 0.60 | 0.05 | Mg: 0.07<br>Zn: 0.09<br>Al: 0.04<br>Zn: 0.06<br>Mn: 0.01 | 0.036 | bal. | 74 | 6.5 | 68 | 500 |
| 42 | 0.51 | 0.053 | 0.023 | 0.50 | 0.53 | 0.59 | 0.05 | P: 0.01<br>Al: 0.06<br>Zn: 0.13<br>Mn: 0.02 | 0.038 | bal. | 75 | 6.3 | 69 | 510 |

EXAMPLE 3

Melts of Cu alloy having the compositions shown in Table 3 were treated as in Example 1 to fabricate hot-rolled plates of 11 mm in thickness. The plates were then quenched with a water spray to reduce the sizes of eutectic crystals and crystalline grains without inducing the formation of any precipitate. The top and bottom surfaces of each plate were polished so as to reduce the plate thickness by 0.5 mm and thus attain a final thickness of 10 mm. Subsequently, the plates were cold-rolled to attain a thickness of 2 mm and fine precipitates were caused to form by aging, this being achieved by holding the plates for 60 minutes at predetermined temperatures within the range of 400°–550° C. The aged plates were cold-rolled to attain a further reduction in thickness down to 0.7 mm, and were annealed to eliminate any residual strain by holding them for 60 minutes at predetermined temperatures within the range of 400°–500° C. The so treated plates were subjected to the final stage of cold rolling to fabricate sample Nos. 43–59 of the Cu alloy lead material of the present invention each having a thickness of 0.3 mm. The average grain sizes of the eutectic crystals, precipitates and crystalline grains in these samples were measured. Measurements were also conducted with respect to the tensile strength, elongation, electrical conductivity and softening point of each sample. The results are shown in Table 3.

TABLE 3

| Sample No. | Composition (wt %) | | | | | | Average grain size (μm) | | | tensile strength (kgf/mm²) | elongation (%) | conductivity (% IACS) | softening point (°C.) |
|---|---|---|---|---|---|---|---|---|---|---|---|---|---|
| | Cr | Zr | metal of the first group | metal of the second group | metal of the third group | Cu | eutectic crystal | precipitate | crystalline grain | | | | |
| 43 | 0.54 | — | — | — | — | bal. | 8 | 0.04 | 47 | 52 | 16.1 | 85 | 405 |
| 44 | — | 0.131 | — | — | — | bal. | 9 | 0.03 | 44 | 50 | 12.0 | 88 | 400 |
| 45 | 0.93 | — | Ni: 0.83 | — | — | bal. | 4 | 0.07 | 30 | 77 | 6.2 | 65 | 520 |
| 46 | 0.13 | 0.091 | Fe: 0.31<br>Co: 0.53 | — | — | bal. | 6 | 0.10 | 47 | 53 | 10.5 | 82 | 470 |
| 47 | 0.32 | 0.151 | — | Mg: 0.15 | — | bal. | 3 | 0.04 | 37 | 54 | 8.6 | 83 | 485 |
| 48 | 0.64 | — | — | Al: 0.21<br>Mn: 0.31<br>B: 0.0016 | — | bal. | 5 | 0.05 | 27 | 63 | 9.2 | 82 | 465 |
| 49 | 0.41 | 0.283 | — | Si: 0.30<br>Zn: 0.13<br>P: 0.005 | — | bal. | 5 | 0.05 | 34 | 65 | 8.7 | 83 | 515 |
| 50 | 0.50 | 0.121 | — | — | Ti: 0.016 | bal. | 6 | 0.07 | 38 | 58 | 9.1 | 84 | 505 |
| 51 | 0.48 | 0.096 | — | — | Nb: 0.31<br>V: 0.21<br>Mo: 0.64 | bal. | 7 | 0.06 | 34 | 60 | 9.0 | 82 | 510 |
| 52 | 0.052 | 0.264 | — | — | Ta: 0.25<br>Hf: 0.31<br>W: 0.52 | bal. | 4 | 0.03 | 24 | 51 | 10.5 | 87 | 470 |
| 53 | 0.31 | 0.122 | Sn: 0.33<br>Co: 0.14 | Li: 0.03<br>Y: 0.42<br>La: 0.10 | — | bal. | 3 | 0.04 | 23 | 56 | 9.7 | 86 | 480 |
| 54 | 0.54 | 0.231 | Be: 0.0054 | Mg: 0.33<br>P: 0.016<br>Ce: 0.24 | — | bal. | 5 | 0.05 | 38 | 65 | 8.7 | 83 | 515 |
| 55 | 0.83 | — | — | B: 0.0016<br>Y: 0.36 | W: 0.96 | bal. | 2 | 0.03 | 25 | 76 | 6.0 | 66 | 525 |
| 56 | 0.27 | 0.290 | — | Al: 0.54 | Ti: 1.05<br>Mo: 0.54 | bal. | 5 | 0.06 | 41 | 66 | 6.8 | 67 | 500 |
| 57 | 0.52 | — | Ni: 1.54<br>Be: 0.013 | — | V: 0.32<br>W: 0.34 | bal. | 4 | 0.05 | 38 | 72 | 6.5 | 52 | 500 |
| 58 | 0.32 | 0.090 | Sn: 0.0064 | — | Ta: 0.85 | bal. | 3 | 0.04 | 26 | 54 | 9.4 | 85 | 490 |
| 59 | 0.36 | 0.126 | Ni: 0.54<br>Sn: 0.34 | Mg: 0.13<br>Al: 0.046 | Ti: 0.35<br>Ce: 0.0063 | bal. | 6 | 0.07 | 34 | 55 | 9.4 | 81 | 485 |

The data in table 3 shows that each of the samples (Nos. 43–59) of the Cu alloy lead material of the present invention exhibited a tensile strength of 50 kgf/mm² or more, an elongation of 6% or more, an electrical conductivity of 52% IACS or more, and a softening point of 400° C. or higher. These values are indicative of the fact that the samples of the Cu alloy lead material of the present invention exhibit heretofore unattainable high levels of strength and elongation and yet satisfy the other requirements with respect to the characteristics which lead materials for use in semiconductor devices need to possess.

EXAMPLE 4

Melts of Cu alloy having the compositions shown in values are indicative of the fact that the samples (Nos. 60–79) of the Cu alloy lead material of the present invention exhibit heretofore unattainable high levels of strength and elongation and yet satisfy the other requirements for lead materials to be used in semiconductor devices.

TABLE 4

| Sample No. | Composition (wt %) | | | | | | | Cu and other impurities | tensile strength (kgf/mm$^2$) | elongation (%) | conductivity (% IACS) | softening point (°C.) |
|---|---|---|---|---|---|---|---|---|---|---|---|---|
| | Cr | Zr | C (ppm) | metal of the first group | metal of the second group | metal of the third group | O$_2$ | | | | | |
| 60 | — | 0.143 | 20 | — | — | — | 25 | bal. | 51 | 12.1 | 86 | 410 |
| 61 | 0.34 | 0.01 | 30 | — | — | — | 10 | bal. | 55 | 10.3 | 79 | 470 |
| 62 | 0.33 | 0.102 | 15 | — | — | — | 30 | bal. | 54 | 10.0 | 87 | 475 |
| 63 | 0.83 | 0.120 | 25 | Sn: 0.68 | — | — | 15 | bal. | 63 | 8.4 | 74 | 520 |
| 64 | 0.25 | — | 30 | Ni: 0.22 Fe: 0.33 Be: 0.0059 | — | — | 10 | bal. | 58 | 9.5 | 72 | 465 |
| 65 | 0.54 | — | 25 | Co: 0.96 Be: 0.16 | — | — | 15 | bal. | 71 | 6.5 | 53 | 505 |
| 66 | 0.42 | 0.203 | 30 | — | Al: 0.093 | — | 10 | bal. | 63 | 8.6 | 78 | 500 |
| 67 | 0.33 | 0.05 | 30 | — | Mg: 0.13 Si: 0.054 P: 0.046 | — | 10 | bal. | 56 | 9.6 | 74 | 470 |
| 68 | — | 0.254 | 55 | — | Zn: 1.76 Y: 0.13 Ce: 0.045 | — | 5 | bal. | 55 | 10.9 | 68 | 440 |
| 69 | 0.43 | 0.091 | 30 | — | Mn: 0.33 Li: 0.13 La: 0.0071 | — | 15 | bal. | 64 | 9.0 | 72 | 490 |
| 70 | — | 0.132 | 35 | — | — | Ti: 0.12 W: 0.24 | 15 | bal. | 55 | 11.9 | 78 | 415 |
| 71 | 0.69 | — | 35 | — | — | V: 0.054 Ta: 0.13 Mo: 0.21 | 15 | bal. | 72 | 6.6 | 52 | 515 |
| 72 | 0.13 | 0.0064 | 40 | — | — | Nb: 1.54 Hf: 0.013 | 10 | bal. | 55 | 9.3 | 65 | 495 |
| 73 | 0.34 | — | 40 | Ni: 0.33 | Li: 0.43 | — | 10 | bal. | 61 | 9.7 | 74 | 460 |
| 74 | 0.71 | — | 25 | Be: 0.26 Sn: 0.59 | Al: 0.63 B: 0.0056 | — | 20 | bal. | 71 | 8.0 | 71 | 490 |
| 75 | 0.75 | 0.019 | 30 | Fe: 0.018 Co: 0.19 | — | Ti: 0.69 | 25 | bal. | 73 | 6.2 | 63 | 480 |
| 76 | — | 0.291 | 25 | Sn: 0.22 Ni: 0.34 Co: 0.20 | — | Nb: 0.13 Ta: 0.29 Mo: 0.26 | 20 | bal. | 54 | 9.8 | 57 | 455 |
| 77 | — | 0.030 | 35 | — | Y: 0.13 | Mo: 0.54 W: 0.20 | 15 | bal. | 51 | 10.3 | 76 | 410 |
| 78 | 0.24 | 0.194 | 35 | — | Al: 0.018 Mn: 0.22 P: 0.105 | V: 0.017 Ta: 0.86 | 25 | bal. | 61 | 9.1 | 76 | 505 |
| 79 | 0.53 | 0.113 | 30 | Ni: 0.22 Sn: 0.30 | Li: 0.064 Y: 0.0091 | Nb: 0.42 Hf: 0.41 | 25 | bal. | 65 | 8.7 | 66 | 510 |

Table 4 were prepared by the following procedures using a conventional type of low-frequency channel induction-melting furnace: a Cu charge enclosed with graphite plates was melted in an argon atmosphere; after meltdown and when its temperature was risen to a predetermined level between 1220° and 1480° C., gas was blown into the melt so as to degas and agitate the melt; the necessary alloying elements were added to the melt under agitation; finally, a carbon monoxide gas was blown such that the content of oxygen as an incidental impurity dropped to 35 ppm or below while the carbon content was adjusted to a predetermined level within the range of 5–60 ppm.

The melts so prepared were subsequently treated in an argon atmosphere as in Example 1 so as to fabricate sample Nos. 60–79 of the Cu alloy lead material of the present invention. The tensile strength, elongation, electrical conductivity and softening point of each sample were measured, the results being shown in Table 4, from which one can see that each sample had a tensile strength of 51 kgf/mm$^2$ or more, an elongation of 6.2% or more, an electrical conductivity of 52% IACS and more, and a softening point of 410° C. or higher. These

EXAMPLE 5

Melts of Cu alloy having the compositions shown in Table 5 were prepared by repeating the procedures of Example 4. They were subsequently treated in an argon atmosphere as in Example 3 to fabricate sample Nos. 80–99 of the Cu alloy lead material of the present invention. The average grain sizes of the eutectic crystals, precipitates and crystalline grains in these samples were measured. Measurements were also conducted with respect to the tensile strength, elongation, electrical conductivity and softening point of each sample. The results are shown in Table 6. As is clear from the data in Table 6, each of the samples (Nos. 80–99) of the Cu alloy lead material of the present invention had a tensile strength of 52 kgf/mm$^2$ or more, an elongation of 6.2% or more, an electrical conductivity of 53% IACS or more, and a softening point of 410° C. or higher. These values are indicative of the fact that the samples of the Cu alloy lead material of the present invention exhibit heretofore unattainable high levels of strength and elongation and yet satisfy the other requirements for lead materials to be used in semiconductor devices.

TABLE 5

| Sample No. | Cr | Zr | C (ppm) | metal of the first group | metal of the second group | metal of the third group | $O_2$ | Cu and other impurities |
|---|---|---|---|---|---|---|---|---|
| 80 | 0.11 | — | 25 | — | — | — | 10 | bal. |
| 81 | — | 0.123 | 30 | — | — | — | 15 | bal. |
| 82 | 0.53 | — | 20 | — | — | — | 15 | bal. |
| 83 | 0.84 | 0.0056 | 15 | Ni: 1.54 | — | — | 20 | bal. |
| 84 | 0.23 | — | 25 | Sn: 0.13<br>Be: 0.0059 | — | — | 15 | bal. |
| 85 | 0.36 | 0.032 | 10 | Sn: 0.33<br>Fe: 0.41<br>Co: 0.36 | — | — | 25 | bal. |
| 86 | 0.35 | 0.090 | 30 | — | Si: 0.020<br>Mg: 0.54 | — | 10 | bal. |
| 87 | 0.64 | — | 35 | — | Si: 0.13<br>Mn: 0.23<br>P: 0.14 | — | 10 | bal. |
| 88 | — | 0.264 | 50 | — | Al: 0.0013<br>Zn: 0.13<br>B: 0.021 | — | 5 | bal. |
| 89 | 0.43 | 0.064 | 30 | — | Li: 0.0013<br>Ce: 0.0016<br>Y: 0.0011 | — | 10 | bal. |
| 90 | — | 0.154 | 35 | — | — | Ti: 0.16<br>Nb: 0.33<br>Mo: 0.21 | 5 | bal. |
| 91 | 0.32 | — | 5 | — | — | V: 0.0094<br>Hf: 0.13<br>W: 0.41 | 35 | bal. |
| 92 | 0.13 | 0.104 | 15 | Ni: 0.14<br>Be: 0.23 | La: 0.019<br>Y: 0.024<br>P: 0.043 | — | 15 | bal. |
| 93 | 0.69 | 0.165 | 25 | Sn: 0.64 | P: 0.13 | — | 10 | bal. |
| 94 | — | 0.154 | 15 | Ni: 0.32<br>Co: 0.14<br>Fe: 0.33 | — | Mo: 1.96 | 20 | bal. |
| 95 | 0.48 | — | 25 | Be: 0.0041 | — | V: 0.0063<br>W: 0.039 | 10 | bal. |
| 96 | 0.12 | 0.0064 | 20 | — | Al: 0.41<br>Mn: 0.11<br>Li: 0.13 | Ti: 0.36<br>Ta: 0.21<br>Mo: 0.21 | 15 | bal. |
| 97 | 0.30 | — | 25 | — | Mg: 0.026<br>P: 0.018 | La: 0.13<br>Ce: 0.21<br>Zn: 0.41 | 10 | bal. |
| 98 | 0.79 | — | 20 | Co: 0.34<br>Be: 0.12 | Mg: 0.31<br>Al: 0.26 | W: 0.65 | 15 | bal. |
| 99 | 0.32 | 0.060 | 30 | Sn: 0.064<br>Ni: 0.71 | Li: 0.0050<br>Si: 0.030 | Ti: 0.35 | 10 | bal. |

TABLE 6

| Sample No. | Average grain size (μm) | | | tensile strength (kgf/mm²) | elongation (%) | conductivity (% IACS) | softening point (°C.) |
|---|---|---|---|---|---|---|---|
| | eutectic crystal | precipitate | crystalline grain | | | | |
| 80 | 7 | 0.07 | 43 | 52 | 16.4 | 85 | 410 |
| 81 | 9 | 0.10 | 47 | 53 | 12.2 | 85 | 410 |
| 82 | 6 | 0.04 | 42 | 55 | 16.2 | 83 | 410 |
| 83 | 4 | 0.03 | 26 | 78 | 6.5 | 60 | 530 |
| 84 | 5 | 0.04 | 35 | 57 | 9.2 | 75 | 465 |
| 85 | 8 | 0.07 | 43 | 66 | 8.3 | 68 | 520 |
| 86 | 5 | 0.03 | 37 | 57 | 10.7 | 78 | 470 |
| 87 | 7 | 0.08 | 46 | 65 | 9.3 | 77 | 470 |
| 88 | 6 | 0.06 | 41 | 55 | 10.5 | 68 | 445 |
| 89 | 5 | 0.03 | 35 | 63 | 9.5 | 74 | 475 |
| 90 | 5 | 0.04 | 35 | 56 | 11.5 | 72 | 435 |
| 91 | 8 | 0.07 | 42 | 60 | 9.4 | 70 | 475 |
| 92 | 7 | 0.06 | 41 | 64 | 6.6 | 57 | 470 |
| 93 | 4 | 0.03 | 40 | 70 | 6.2 | 58 | 515 |
| 94 | 4 | 0.02 | 36 | 67 | 6.6 | 53 | 485 |
| 95 | 5 | 0.04 | 35 | 58 | 13.7 | 75 | 425 |
| 96 | 3 | 0.02 | 23 | 65 | 8.6 | 67 | 455 |
| 97 | 4 | 0.03 | 37 | 61 | 8.7 | 69 | 480 |
| 98 | 4 | 0.02 | 35 | 76 | 6.2 | 55 | 515 |
| 99 | 5 | 0.03 | 42 | 75 | 6.4 | 63 | 505 |

As will be understood from the foregoing description, the Cu alloy lead material of the present invention exhibits heretofore unattainable increased levels of strength and elongation and yet retains the levels of electrical conductivity and softening point that are required to be exhibited by ordinary semiconductor devices. Therefore, said lead material is applicable not only to ordinary semiconductor devices but also to those of higher packing densities while exhibiting equally superior performance.

What is claimed is:

1. A lead material having high strength and elongation for use in a semiconductor device which consists essentially of a copper alloy that contains either 0.05-1% of Cr or 0.005-0.3% of Zr or both, and which further contains 5-60 ppm of C and one or more of 0-2% of a metal selected from among the group consisting of Ni, Sn, Fe, Co and Be, 0-1% of a metal selected from among the group consisting of Mg, Si, Al, Zn, Mn, B, P, Li, Y and a rare earth element, and 0-2% of a metal selected from among the group consisting of Ti, Nb, V, Ta, Hf, Mo and W, the percent being on a weight basis, with the balance being copper and incidental impurities including no more than 35 ppm of oxygen.

2. A lead material according to claim 1 which contains one or more of 0.005-2% of a metal selected from among the group consisting of Ni, Sn, Fe, Co and Be, 0.001-1% of a metal selected from among the group consisting of Mg, Si, Al, Zn, Mn, B, P, Li, Y and a rare earth element, and 0.005-2% of a metal selected from among the group consisting of Ti, Nb, V, Ta, Hf, Mo and W.

3. A lead material having high strength and elongation for use in a semiconductor device which consists essentially of a copper alloy that contains either 0.05-1% of Cr or 0.005-0.3% of Zr or both, and which further contains 5-60 ppm of C and one or more of 0-2% of a metal selected from among the group consisting of Ni, Sn, Fe, Co and Be, 0-1% of a metal selected from among the group consisting of Mg, Si, Al, Zn, Mn, B, P, Li, Y and a rare earth element, and 0-2% of a metal selected from among the group consisting of Ti, Nb, V, Ta, Hf, Mo and W, the percent being on a weight basis, with the balance being copper and incidental impurities including no more than 35 ppm of oxygen, and which has a structure wherein the average grain size of any eutectic crystal present is no more than 10 $\mu$m, the average grain size of any precipitate present is no more than 0.1 $\mu$m, and the average size of any crystalline grains present is no more than 50 $\mu$m.

4. A lead material according to claim 3 which contains one or more of 0.005-2% of a metal selected from among the group consisting of Ni, Sn, Fe, Co and Be, 0.001-1% of a metal selected from among the group consisting of Mg, Si, Al, Zn, Mn, B, P, Li, Y and a rare earth element, and 0.005-2% of a metal selected from among the group consisting of Ti, Nb, V, Ta, Hf, Mo and W.

* * * * *